US012640227B1

(12) United States Patent
Lee et al.

(10) Patent No.: US 12,640,227 B1
(45) Date of Patent: May 26, 2026

(54) OPTIMIZATION METHOD AND APPARATUS FOR PROGRAM/ERASE VOLTAGE OF CHARGE-TRAP MEMORY DEVICES THROUGH 3D TRAP ANALYSIS

(71) Applicant: Korea University Research and Business Foundation, Sejong Campus, Sejong (KR)

(72) Inventors: Jae Woo Lee, Sejong (KR); Sanghyeok Kim, Sejong (KR); Inkyu Yoon, Sejong (KR); Somi Lee, Sejong (KR); Dong Hyun Kim, Sejong (KR)

(73) Assignee: Korea University Research and Business Foundation, Sejong (KR)

( * ) Notice: Subject to any disclaimer, the term of this patent is extended or adjusted under 35 U.S.C. 154(b) by 0 days.

(21) Appl. No.: 19/418,184

(22) Filed: Dec. 12, 2025

(30) Foreign Application Priority Data

Dec. 23, 2024　　(KR) ........................ 10-2024-0193541

(51) Int. Cl.
　　*G11C 29/56*　　　(2006.01)
　　*G06F 17/18*　　　(2006.01)
　　*G11C 16/14*　　　(2006.01)
(52) U.S. Cl.
　　CPC ........ *G11C 29/56016* (2013.01); *G06F 17/18* (2013.01); *G11C 16/14* (2013.01)
(58) Field of Classification Search
　　CPC ......................... G11C 29/56016; G11C 16/14
　　USPC .............................. 365/201, 185.18, 185.29
　　See application file for complete search history.

(56) References Cited

U.S. PATENT DOCUMENTS

2003/0235080 A1* 12/2003 Yaegashi ............ G11C 16/3468
　　　　　　　　　　　　　　　　　　　365/185.17
2016/0307633 A1* 10/2016 Lee .................... G11C 16/3454

OTHER PUBLICATIONS

Notice of Allowance from the Korea Intellectual Property Rights Information Service, mailed Nov. 6, 2025, for Korean Application No. 10-2024-0193541, 6 pages, with machine generated English translation.
Korean Office Action from the Korea Intellectual Property Rights Information Service, mailed Aug. 27, 2025, for Korean Application No. 10-2024-0193541, 8 pages, with machine generated English translation.
Lee et al., "A subthreshold slope and low-frequency noise characteristics in charge trap flash memories with gate-all-around and planar structure." Journal of Semiconductor Technology and Science 12, No. 3 (2012): 360-369.

* cited by examiner

*Primary Examiner* — Connie C Yoha
(74) *Attorney, Agent, or Firm* — Lee & Hayes, P.C.

(57) ABSTRACT

Disclosed is a method and apparatus for optimizing a program voltage and an erase voltage of a charge-trap memory device through a three-dimensional (3D) trap analysis that may apply each of different trap control voltages to the memory device and measure low-frequency noises of the memory device respectively corresponding to the trap control voltages, may extract trap distributions in the memory device for the trap control voltages based on the low-frequency noises, respectively, and may analyze the trap distributions according to depths of the memory device, and detect a trap control voltage having a maximum trap distribution in a charge trap layer of the memory device, thereby detecting at least one of an optimal program voltage and erase voltage for the memory device.

8 Claims, 4 Drawing Sheets

FIG. 2

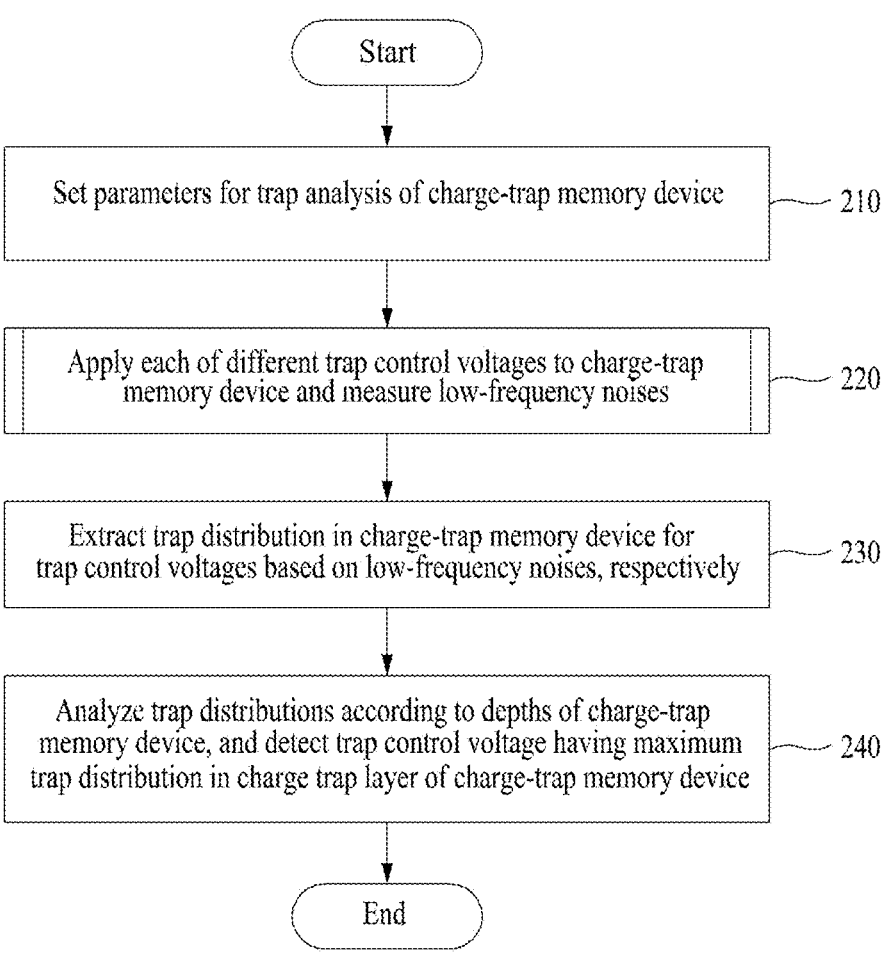

Start

Set parameters for trap analysis of charge-trap memory device — 210

Apply each of different trap control voltages to charge-trap memory device and measure low-frequency noises — 220

Extract trap distribution in charge-trap memory device for trap control voltages based on low-frequency noises, respectively — 230

Analyze trap distributions according to depths of charge-trap memory device, and detect trap control voltage having maximum trap distribution in charge trap layer of charge-trap memory device — 240

End

OPTIMIZATION METHOD AND APPARATUS FOR PROGRAM/ERASE VOLTAGE OF CHARGE-TRAP MEMORY DEVICES THROUGH 3D TRAP ANALYSIS

CROSS-REFERENCE TO RELATED APPLICATION(S)

This application claims the priority benefit of Korean Patent Application No. 10-2024-0193541, filed on Dec. 23, 2024, in the Korean Intellectual Property Office, the disclosure of which is incorporated herein by reference.

BACKGROUND

1. Field of the Invention

Example embodiments of the present disclosure generally relate to optimization of a memory device, and more particularly, to optimization of program/erase voltage of a charge-trap memory device through three-dimensional (3D) trap analysis. This patent was supported by the NRF (RS-2023-00280841).

2. Description of the Related Art

Typically, a charge-voltage (C-V) measurement or a charging pumping scheme has been used to extract the amount of charge trapped in a charge trap layer of a charge-trap memory device. However, the C-V measurement has the disadvantage that the amount of trapped charge may be indirectly known, and the charge pumping scheme may not measure a trap of the charge trap layer during program/erase operations since the measurable trap depth depends on gate voltage.

SUMMARY

The present disclosure provides a method and apparatus for verifying the trap distribution from an interface to a trap layer during program/erase since the trap depth depends on a frequency.

The present disclosure provides a method and apparatus for optimizing a program/erase voltage of a charge-trap memory device through three-dimensional (3D) trap analysis.

Herein, an operating method of a computing device for optimizing a program voltage and an erase voltage of a charge-trap memory device through a three-dimensional (3D) trap analysis may include applying each of different trap control voltages to the memory device and measuring low-frequency noises of the memory device respectively corresponding to the trap control voltages; extracting trap distributions in the memory device for the trap control voltages based on the low-frequency noises, respectively; and analyzing the trap distributions according to depths of the memory device, and detecting a trap control voltage having a maximum trap distribution in a charge trap layer of the memory device.

Herein, a computing device for optimizing a program voltage and an erase voltage of a charge-trap memory device through a three-dimensional (3D) trap analysis may include a memory; and a processor configured to connect to the memory, and to execute at least one instruction stored in the memory, wherein the processor is configured to apply each of different trap control voltages to the memory device and measure low-frequency noises of the memory device respectively corresponding to the trap control voltages, to extract trap distributions in the memory device for the trap control voltages based on the low-frequency noises, respectively, and to analyze the trap distributions according to depths of the memory device, and detect a trap control voltage having a maximum trap distribution in a charge trap layer of the memory device.

The present disclosure may optimize at least one of a program voltage and an erase voltage of a charge-trap memory device based on frequency analysis and depth analysis. That is, the present disclosure may analyze trap distributions according to voltages applied in the charge-trap memory device according to depths, and may detect at least one of an optimal program voltage and erase voltage of the charge-trap memory device. Through this, the charge-trap memory device may operate based on at least one of the optimal program voltage and erase voltage. Therefore, a memory window of the charge-trap memory device may increase. In addition, the electrical stress applied to the charge-trap memory device during operation may be minimized to suppress or prevent degradation in the charge-trap memory device. This may extend the life of the charge-trap memory device and may reduce unnecessary power consumption.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 2 is a flowchart schematically illustrating an operating method of a computing device according to various example embodiments;

DETAILED DESCRIPTION

Hereinafter, the present disclosure provides a method and apparatus for optimizing a program/erase voltage of a charge-trap memory device through three-dimensional (3D) trap analysis. In general, the charge-trap memory device may include a substrate having a source electrode, a drain electrode, and a channel region between the source electrode and the drain electrode, a tunneling layer stacked on the channel region to pass charges injected from the channel region, a charge trap layer stacked on the tunneling layer to trap charges from the tunneling layer, and a gate electrode formed on the charge trap layer, and at least one another component may be added between adjacent components. For example, a blocking layer, for example, an insulating layer may be added between the charge trap layer and the gate electrode. Here, when the tunneling layer and the charge trap layer or the blocking layer are added, the tunneling layer, the charge trap layer, and the blocking layer may be collectively referred to as an oxide layer. The charge-trap memory device has the largest memory window when as many charges as possible are trapped in the charge trap layer during a program operation and as many charges as possible are de-trapped from the charge trap layer during an erase operation. To trap as many charges as possible in the charge trap layer, a trap distribution needs to be small in an interface region between the tunneling layer and the charge trap layer or in the tunneling layer. Meanwhile, since a location (depth) at which trap frequently occurs within the charge-trap memory device varies depending on the applied voltage, this needs to be strategically analyzed. Therefore, the present disclosure proposes technology for acquiring an optimized program/erase voltage through low-frequency noise analysis and depth analysis.

Hereinafter, various example embodiments of the present disclosure are described with reference to the accompanying drawings.

Figure 1:
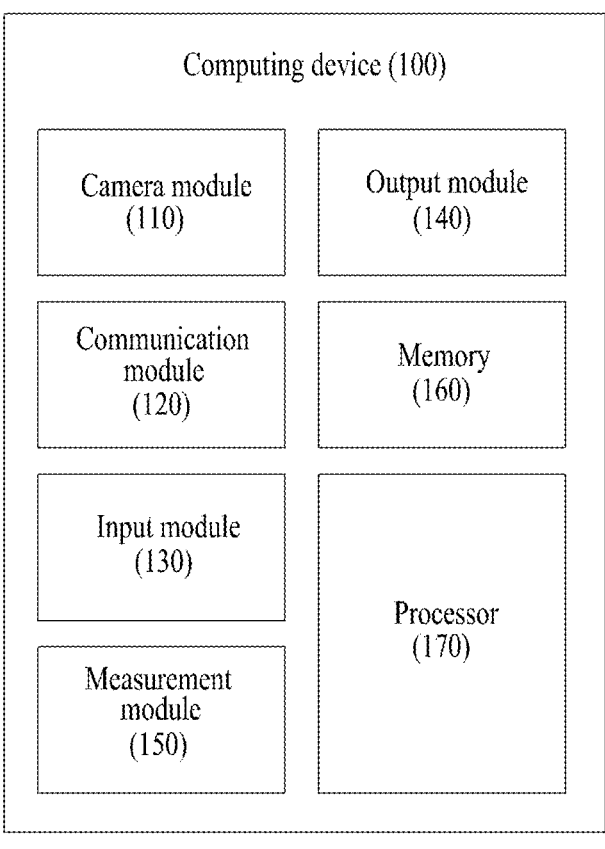
FIG. 1 is a diagram schematically illustrating a computing device according to various example embodiments.

FIG. 1 is a block diagram schematically illustrating a computing device 100 according to various example embodiments.

Referring to FIG. 1, the computing device 100 relates to optimizing a program voltage and an erase voltage of a charge-trap memory device through three-dimensional (3D) trap analysis, and may include at least one of a camera module 110, a communication module 120, an input module 130, an output module 140, a measurement module 150, a memory 160, and a processor 170. In some example embodiments, at least one (e.g., camera module 110, communication module 120) of the components of the computing device 100 may be omitted, and at least one another component may be added. In some example embodiments, at least two of the components of the computing device 100 may be implemented into a single integrated circuitry. In some example embodiments, the components of the computing device 100 may be provided to at least two devices in a distributed manner. Here, the corresponding devices may be connected to be communicable with each other.

The camera module 110 may capture an image in the computing device 100. Here, the camera module 110 may be a red, green, blue (RGB) camera, but is not limited thereto. For example, the camera module 110 may include at least one of a lens, an image sensor, an image signal processor, and a flash.

The communication module 120 may perform communication with an external device (not shown) in the computing device 100. The communication module 120 may establish a communication channel between the computing device 100 and the external device, and may perform communication with the external device through the communication channel. For example, the external device may include at least one of an electronic device, a base station, a server, and a satellite. The communication module 120 may include at least one of a wired communication module and a wireless communication module. For example, the wireless communication module may perform communication with the external device through at least one of a long-range communication network and a short-range communication network.

The input module 130 may input an instruction to be used to at least one component of the computing device 100. The input module 130 may include at least one of an input unit configured to allow a user to directly input an instruction or data to the computing device 100, and a sensor unit configured to detect a surrounding environment and to generate data. For example, the input unit may include at least one of a microphone, a mouse, and a keyboard. In some example embodiments, the input unit may include at least one of a touch circuitry set to detect a touch and a sensor circuitry set to measure intensity of force generated by the touch.

The output module 140 may output information to the outside of the computing device 100. The output module 140 may include at least one of a display module configured to visually output information and an audio module configured to auditorily output information. For example, the display module may include at least one of a display, a holographic device, and a projector. In some example embodiments, the display module may be implemented as a touchscreen through combination with at least one of the touch circuitry and the sensor circuitry of the input module 130. For example, the audio module may include at least one of a speaker and a receiver.

The measurement module 150 may measure low-frequency noise of the charge-trap memory device. The low-frequency noise may include noise that occurs in a drain current of the charge-trap memory device and noise corresponding to a flat band voltage of the charge-trap memory device.

The memory 160 may store a variety of data used by at least one component of the computing device 100. For example, the memory 160 may include at least one of a volatile memory and a nonvolatile memory. Data may include a program or input data or output data for an instruction related to the program. The program may be stored as software in the memory 160, and may include at least one of an operating system, middleware, and an application.

The processor 170 may control at least one component of the computing device 100 by executing the program of the memory 160. Through this, the processor 170 may perform data processing or operation. Here, the processor 170 may execute the instruction stored in the memory 160.

In various example embodiments, the processor 170 may determine at least one of an optimal program voltage and erase voltage for a charge-trap memory device based on 3D trap analysis. The charge-trap memory device has the largest memory window when as many charges as possible are trapped in the charge trap layer during a program operation and as many charges as possible are de-trapped from the charge trap layer during an erase operation. To trap as many charges as possible in the charge trap layer, a trap distribution needs to be small in an interface region between the tunneling layer and the charge trap layer or in the tunneling layer. Meanwhile, a location (depth) at which trap frequently occurs within the charge-trap memory device varies depending on the applied voltage. Therefore, the processor 170 may determine at least one of the optimal program voltage and erase voltage based on low-frequency noise analysis and depth analysis.

In detail, the processor 170 may measure each low-frequency noise of the charge-trap memory device by applying different trap control voltages to the charge-trap memory device through the measurement module 150. Here, the trap control voltages may include different pairs of program voltage and erase voltage, and at least of the program voltage and the erase voltage may be different. The processor 170 may analyze the low-frequency noises, and may extract trap distributions in the charge-trap memory device for trap control voltages, respectively. The processor 170 may analyze the trap distributions according to depths of the charge-trap memory device, and may detect a trap control voltage having the maximum trap distribution in the charge trap layer of the charge-trap memory device. Here, the detected trap control voltage is optimized for the charge-trap memory device, and may include at least one of a program voltage and an erase voltage. Therefore, the charge-trap memory device may operate based on the detected trap control voltage.

Figure 3:
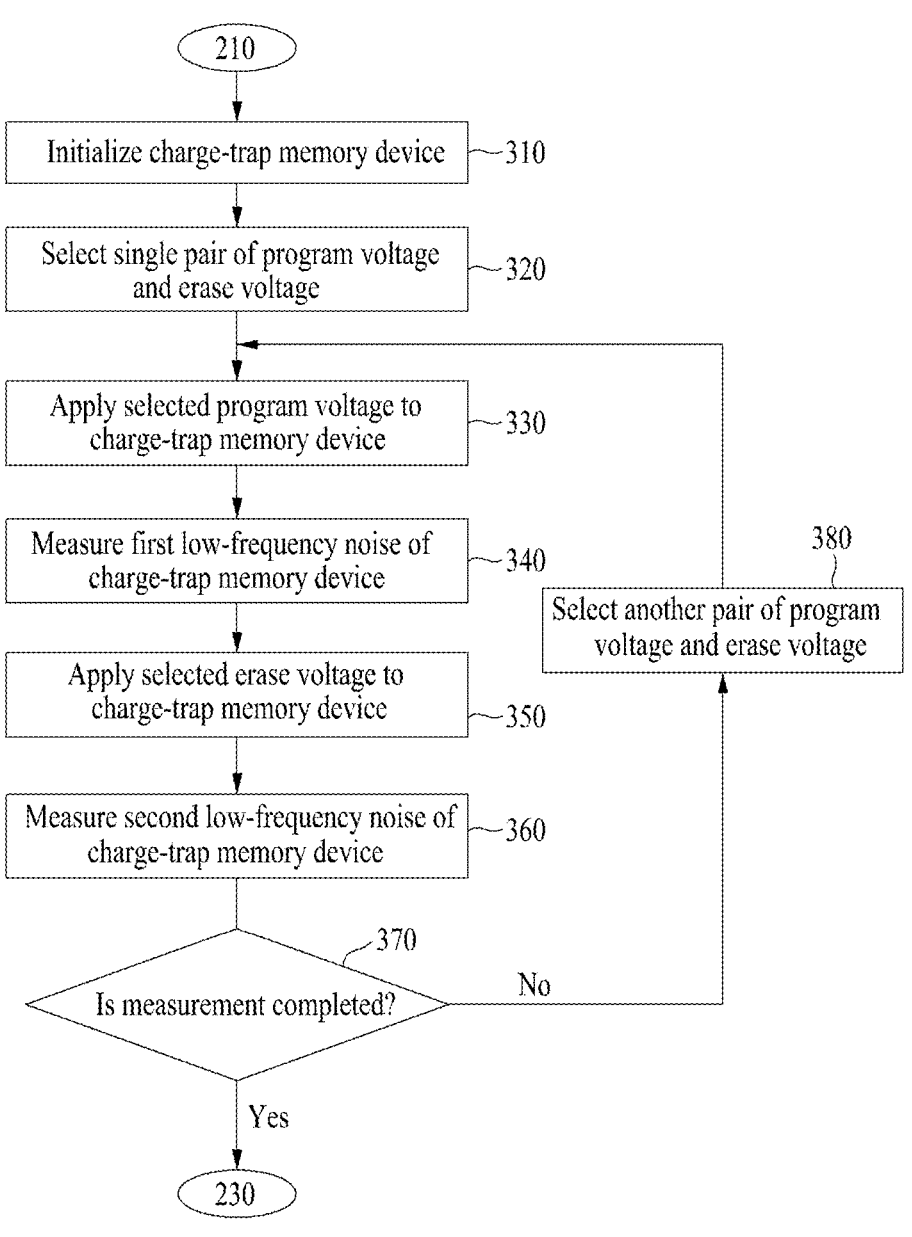
FIG. 3 is a flowchart illustrating an operation of measuring each low-frequency noise in FIG. 2 in detail.
Figure 4:
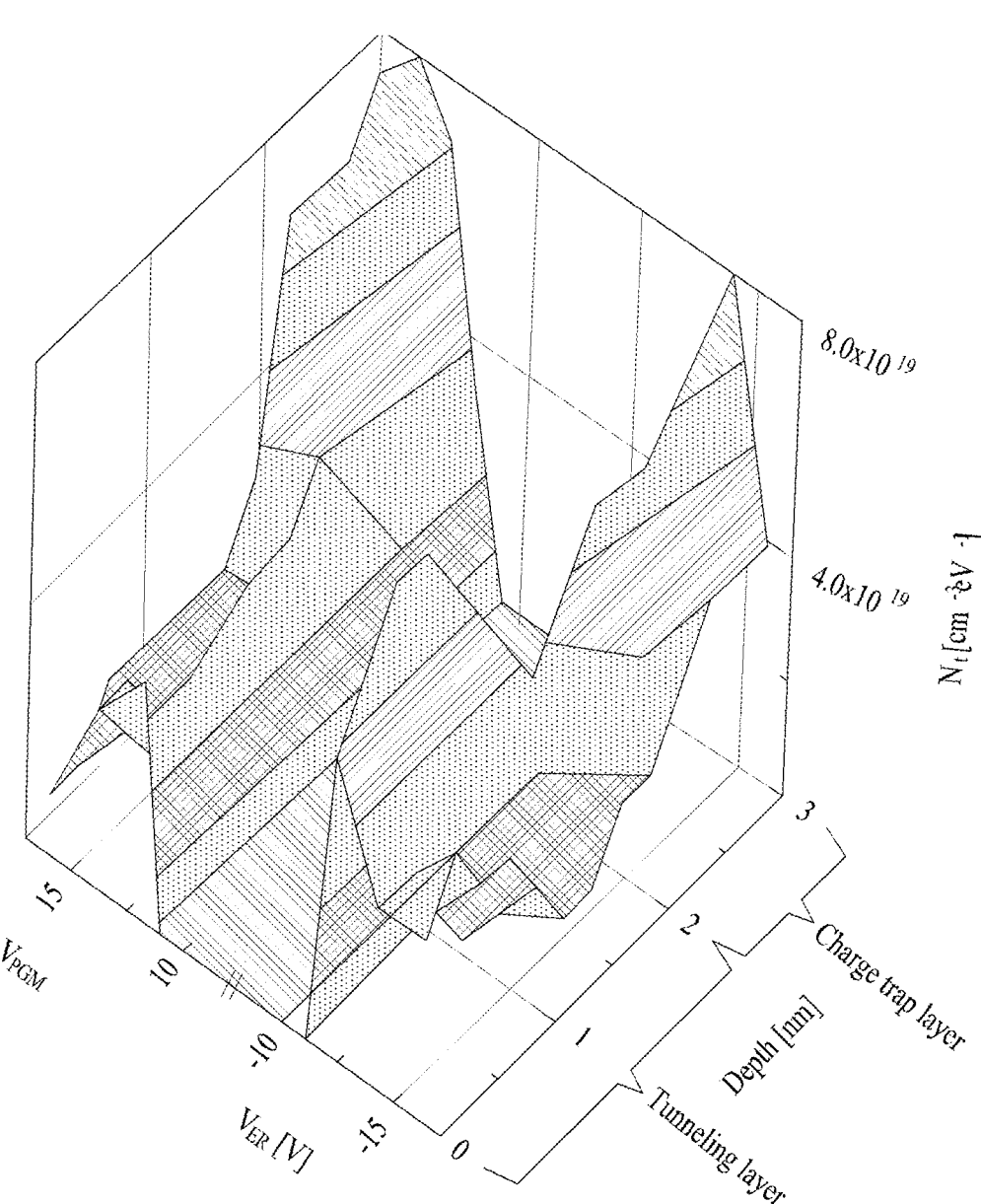
FIG. 4 exemplifies a three-dimensional (3D) graph showing the relationship among trap control voltages, trap distributions, and depths expressed in an operation of detecting a trap control voltage in FIG. 2.

FIG. 2 is a flowchart schematically illustrating an operating method of the computing device 100 according to various example embodiments. FIG. 3 is a flowchart illustrating operation 220 of measuring each low-frequency noise in FIG. 2 in detail. FIG. 4 exemplifies a 3D graph showing relationship among trap control voltages, trap distributions, and depths expressed in operation 240 of detecting a trap control voltage in FIG. 2.

Referring to FIG. 2, in operation 210, the computing device 100 may set parameters for trap analysis of a charge-trap memory device. In detail, the processor 170 may set parameters based on information input through at least one of the camera module 110, the communication module 120, and the input module 130. Here, the parameters may include factors extracted from the charge-trap memory device and factors applied to the charge-trap memory device. Here, the parameters may include a temperature condition and a voltage range. The voltage range may represent the range between a lower limit and an upper limit to which the trap control voltages belong, and the voltage range of program voltages and the voltage range of erase voltages may be different or the same.

In operation 220, the computing device 100 may apply each of different trap control voltages to the charge-trap memory device, and may measure low-frequency noises of the memory device respectively corresponding to the trap control voltages. In detail, the processor 170 may apply each of the different trap control voltages based on the set parameters. Here, the processor 170 may determine trap control voltages within the set voltage range. The trap control voltages may include different pairs of program voltage and erase voltage, and at least one of program voltage and erase voltage may be different. Therefore, the processor 170 may measure each of low-frequency noises of the charge-trap memory device respectively corresponding to the trap control voltages. The low-frequency noises may include noise that occurs in a drain current of the charge-trap memory device, corresponding to each of the trap control voltages, and noise corresponding to a flat band voltage of the charge-trap memory device. It is further described with reference to FIG. 3.

Referring to FIG. 3, in operation 310, the processor 170 may initialize the charge-trap memory device. In detail, the processor 170 may apply an arbitrary erase voltage to the charge-trap memory device through the measurement module 150. Therefore, due to the applied erase voltage, a charge trapped in the charge-trap memory device may be de-trapped. Here, the applied erase voltage may be inside or outside the voltage range set in operation 210 and, for example, may correspond to the upper limit of the set voltage range.

In operation 320, the processor 170 may select a single pair of program voltage and erase voltage. The trap control voltages may include different pairs of program voltage and erase voltage, and at least one of program voltage and erase voltage may be different. Therefore, the processor 170 may select a single pair of program voltage and erase voltage by selecting one of the trap control voltages.

In operation 330, the processor 170 may apply the selected program voltage to the charge-trap memory device. In detail, the processor 170 may apply the selected program voltage to the charge-trap memory device through the measurement module 150. Thus, due to the applied program voltage, charge may be trapped in the charge-trap memory device. Then, in operation 340, the processor 170 may measure first low-frequency noise of the charge-trap memory device. In detail, the processor 170 may measure the first low-frequency noise corresponding to the selected program voltage through the measurement module 150.

In operation 350, the processor 170 may apply the selected erase voltage to the charge-trap memory device. In detail, the processor 170 may apply the selected erase voltage to the charge-trap memory device through the measurement module 150. Therefore, due to the applied erase voltage, charges may be de-trapped from the charge-trap memory device. Then, in operation 360, the processor 170 may measure second low-frequency noise of the charge-trap memory device. In detail, the processor 170 may measure the second low-frequency noise corresponding to the selected erase voltage through the measurement module 150.

In operation 370, the processor 170 may determine whether measurement of the charge-trap memory device is completed. In detail, the processor 170 may determine whether all trap control voltages, that is, all pairs of program voltage and erase voltage are measured. When it is determined that the measurement is not completed in operation 370, the processor 170 may select another one of the trap control voltages, that is, another pair of program voltage and erase voltage in operation 325 in operation 380. Then, the processor 170 may return to operation 330. In this manner, the processor 170 may iteratively measure first low-frequency noises and second low-frequency noises corresponding to all trap control voltages, that is, all pairs of program voltage and erase voltage. As a result, when it is determined that the measurement is completed in operation 370, the processor 170 may proceed with operation 230 of FIG. 2.

Referring again to FIG. 2, in operation 230, the computing device 100 may extract trap distributions in the charge-trap memory device for the trap control voltages based on the low-frequency noises, respectively. In detail, the processor 170 may extract the trap distributions in the charge-trap memory device for the trap control voltages, respectively, using normalized power spectrum densities (nPSDs) of the drain current and the flat band voltage. Here, the processor 170 may calculate each of the trap distributions using [Equation 1] below.

$$\frac{S_{I_D}}{I_D^2} = S_{cf0}\left(1 + \alpha\mu_{eff}C_{cz}\frac{I_D}{g_m}\right)^2 \cdot \left(\frac{g_m}{I_D}\right)^2 \qquad \text{[Equation 1]}$$

Here, $I_D$ denotes the drain current, $S_{I_D}$ denotes a spectrum density of the noise that occurs in the drain current, $S_{vfb}$ denotes a spectrum density of the noise corresponding to the flat band voltage and may be calculated as shown in [Equation 2] below, $\alpha$ denotes a Coulomb scattering coefficient, Jeff denotes effective mobility of charge, Cox denotes capacitance of an oxide layer of the charge-trap memory device, and $g_m$ denotes transconductance of the charge-trap memory device.

$$S_{cf0} = \frac{q^2 k_B T \lambda N_t}{fWLCox^2} \qquad \text{[Equation 2]}$$

Here, q denotes a charge amount, $k_B$ denotes a Boltzmann constant, T denotes absolute temperature, $\lambda$ denotes an interface between the charge trap layer and a tunneling layer and a tunneling distance (depth) of the tunneling layer, $N_t$ denotes a charge trap density, f denotes a frequency, W denotes a width of a channel region for injecting charges into the charge trap layer, and L denotes a length of the channel region.

In operation 240, the computing device 100 may analyze the trap distributions according to depths of the charge-trap memory device, and may detect a trap control voltage having a maximum trap distribution in the charge trap layer of the charge-trap memory device. Here, the detected trap control voltage is optimized for the charge-trap memory device, and may include at least one of the program voltage and the erase voltage. In detail, the processor 170 may analyze the trap distributions according to the depths of the charge-trap memory device, and may verify the depths of the charge trap layer of the charge-trap memory device respectively corresponding to the trap control voltages. Here, the processor 170 may calculate the depths of the charge-trap memory device using [Equation 3] below. Therefore, the processor 170 may verify relationship among the trap control voltages, the trap distributions, and the depths. For example, as shown in FIG. 4, the processor 170 may represent the relationship among the trap control voltages, the trap distributions, and the depths as a 3D graph. This may represent the trap distributions at the depths of the tunneling layer and the depths of the charge trap layer of the charge-trap memory device according to the trap control voltages. Therefore, the processor 170 may compare the trap distributions at the depths of the charge trap layer, and may detect the trap control voltage having the maximum trap distribution in the charge trap layer.

$$\text{Depth} = \lambda \cdot \ln\left(\frac{1}{2\pi f \tau_0}\right) \qquad \text{[Equation 3]}$$

Here, Depth denotes the depths of the charge-trap memory device, $\lambda$ denotes an interface between the charge trap layer and the tunneling layer and a tunneling distance of the tunneling layer, f denotes a frequency, and $\tau_0$ denotes a time constant in an interface region between the charge trap layer and the tunneling layer of the charge-trap memory device.

In more detail, the processor 170 may extract the trap distributions for the program voltages based on the first low-frequency noises, respectively. Then, the processor 170 may analyze the trap distributions for the program voltages according to the depths of the charge-trap memory device, and may detect a program voltage having the maximum trap distribution in the charge trap layer of the charge-trap memory device. Meanwhile, the processor 170 may extract the trap distributions for the erase voltages based on the second low-frequency noises, respectively. Then, the processor 170 may analyze the trap distributions for the erase voltages according to the depths of the charge-trap memory device, and may detect an erase voltage having the maximum trap distribution in the charge trap layer of the charge-trap memory device.

According to the present disclosure, the computing device 100 may optimize the program voltage or the erase voltage of the charge-trap memory device. That is, the processor 170 may set at least one of the optimal program voltage and erase voltage for the charge-trap memory device. Therefore, the charge-trap memory device may operate based on at least one of the optimal program voltage and erase voltage.

The present disclosure may optimize at least one of the program voltage and the erase voltage of the charge-trap memory device based on frequency analysis and depth analysis. That is, the present disclosure may analyze trap distributions according to voltages applied in the charge-trap memory device according to depths and may detect at least one of an optimal program voltage and erase voltage of the charge-trap memory device. Through this, the charge-trap memory device may operate based on at least one of the optimal program voltage and erase voltage. Therefore, a memory window of the charge-trap memory device may increase. In addition, the electrical stress applied to the charge-trap memory device during operation may be minimized to suppress or prevent degradation in the charge-trap memory device. This may extend the life of the charge-trap memory device and may reduce unnecessary power consumption.

In summary, the present disclosure provides an operating method of the computing device 100 for optimizing a program voltage and an erase voltage of a charge-trap memory device through 3D trap analysis.

Herein, the operating method of the computing device 100 may include applying each of different trap control voltages to the charge-trap memory device and measuring low-frequency noises of the charge-trap memory device respectively corresponding to the trap control voltages (operation 220); extracting trap distributions in the charge-trap memory device for the trap control voltages based on the low-frequency noises, respectively (operation 230); and analyzing the trap distributions according to depths of the charge-trap memory device, and detecting a trap control voltage having a maximum trap distribution in a charge trap layer of the charge-trap memory device (operation 240).

Herein, the trap control voltage may include at least one of a program voltage and an erase voltage.

Herein, the low-frequency noises may include noise that occurs in a drain current of the charge-trap memory device, corresponding to each of the trap control voltages, and noise of a flat band voltage of the charge-trap memory device.

Herein, operation 230 of detecting the trap control voltage may include analyzing the trap distributions according to depths of the charge-trap memory device, and verifying depths of the charge trap layer of the charge-trap memory device corresponding to the trap control voltages, respectively; and comparing the trap distributions in the depths of the charge trap layer, and detecting the trap control voltage having the maximum trap distribution in the charge trap layer.

Herein, operation 230 of extracting the trap distributions may extract the trap distributions, respectively, using [Equation 1] and [Equation 2] above.

Herein, the depths of the charge-trap memory device may be calculated using [Equation 3] above.

Herein, the trap control voltages may include different pairs of program voltage and erase voltage, and at least one of the program voltage and the erase voltage may be different, and operation 220 of measuring the low-frequency noises may be iteratively performed for the pairs.

Herein, operation 220 of measuring the low-frequency noises may include applying the program voltage of a single pair to the charge-trap memory device and measuring first low-frequency noise of the charge-trap memory device (operations 330 and 340); and applying the erase voltage of the single pair to the charge-trap memory device and measuring second low-frequency noise of the charge-trap memory device (operations 350 and 360), first low-frequency noises measured from the pairs may be used to detect a program voltage having a maximum trap distribution in the charge trap layer, and second low-frequency noises measured from the pairs may be used to detect an erase voltage having the maximum trap distribution in the charge trap layer.

Herein, the computing device 100 may include the memory 160, and the processor 170 configured to connect to the memory 160, and to execute at least one instruction stored in the memory 160, and the processor 170 may be configured to apply each of different trap control voltages to the charge-trap memory device and measure low-frequency noises of the charge-trap memory device respectively corresponding to the trap control voltages, to extract trap distributions in the charge-trap memory device for the trap control voltages based on the low-frequency noises, respectively, and to analyze the trap distributions according to depths of the charge-trap memory device and detect a trap control voltage having a maximum trap distribution in a charge trap layer of the charge-trap memory device.

Herein, the trap control voltage may include at least one of a program voltage and an erase voltage.

Herein, the low-frequency noises may include noise that occurs in a drain current of the charge-trap memory device, corresponding to each of the trap control voltages, and noise of a flat band voltage of the charge-trap memory device.

Herein, the processor 170 may be configured to analyze the trap distributions according to depths of the charge-trap memory device, and verify depths of the charge trap layer of the charge-trap memory device corresponding to the trap control voltages, respectively, and to compare the trap distributions in the depths of the charge trap layer, and detect the trap control voltage having the maximum trap distribution in the charge trap layer.

Herein, the processor 170 may extract the trap distributions, respectively, using [Equation 1] and [Equation 2] above.

Herein, the processor 170 may calculate each of the depths of the charge-trap memory device using [Equation 3] above.

Herein, the trap control voltages may include different pairs of program voltage and erase voltage, and at least one of the program voltage and the erase voltage may be different, and the processor 170 may be configured to iteratively measure the low-frequency noises for the pairs.

Herein, the processor 170 may be configured to apply the program voltage of a single pair to the charge-trap memory device and measure first low-frequency noise of the charge-trap memory device, and to apply the erase voltage of the single pair to the charge-trap memory device and measure second low-frequency noise of the charge-trap memory device, first low-frequency noises measured from the pairs may be used to detect a program voltage having a maximum trap distribution in the charge trap layer, and second low-frequency noises measured from the pairs may be used to detect an erase voltage having the maximum trap distribution in the charge trap layer.

The apparatuses described herein may be implemented using hardware components, software components, and/or a combination of the hardware components and the software components. For example, the apparatuses and the components described herein may be implemented using one or more general-purpose or special purpose computers, for example, a processor, a controller, an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that the processing device may include multiple processing elements and/or multiple types of processing elements. For example, the processing device may include multiple processors or a processor and a controller. In addition, other processing configurations are possible, such as parallel processors.

The software may include a computer program, a piece of code, an instruction, or some combinations thereof, for independently or collectively instructing or configuring the processing device to operate as desired. Software and/or data may be embodied in any type of machine, component, physical equipment, computer storage medium or device, to provide instructions or data to the processing device or be interpreted by the processing device. The software also may be distributed over network coupled computer systems so that the software is stored and executed in a distributed fashion. The software and data may be stored by one or more computer readable storage mediums.

The methods according to various example embodiments may be implemented in a form of a program instruction executable through various computer methods and recorded in computer-readable media. Here, the media may be to continuously store a computer-executable program or to temporarily store the same for execution or download. The media may be various types of recording methods or storage methods in which a single piece of hardware or a plurality of pieces of hardware are combined and may be distributed over a network without being limited to a medium that is directly connected to a computer system. Examples of the media include magnetic media such as hard disks, floppy disks, and magnetic tapes; optical media such as CD ROM and DVD; magneto-optical media such as floptical disks; and hardware devices that are specially configured to store and perform program instructions, such as read-only memory (ROM), random access memory (RAM), flash memory, and the like. Examples of other media may include recording media and storage media managed by an app store that distributes applications or a site, a server, and the like that supplies and distributes other various types of software.

Various example embodiments and the terms used herein are not construed to limit description disclosed herein to a specific implementation and should be understood to include various modifications, equivalents, and/or substitutions of a corresponding example embodiment. In the drawings, like reference numerals refer to like components throughout the present specification. The singular forms "a," "an," and "the" are intended to include the plural forms as well, unless the context clearly indicates otherwise. Herein, the expressions, "A or B," "at least one of A and/or B," "A, B, or C," "at least one of A, B, and/or C," and the like may include any possible combinations of listed items. Terms "first," "second," etc., are used to describe corresponding components regardless of order or importance and the terms are simply used to distinguish one component from another component. The components should not be limited by the terms. When a component (e.g., first component) is described to be "(functionally or communicatively) connected to" or "accessed to" another component (e.g., second component), the component may be directly connected to the other component or may be connected through still another component (e.g., third component).

According to various example embodiments, each of the components (e.g., module or program) may include a singular object or a plurality of objects. According to various example embodiments, at least one of the components or operations may be omitted. Alternatively, at least one another component or operation may be added. Alternatively or additionally, a plurality of components (e.g., modules or programs) may be integrated into a single component. In this case, the integrated component may perform one or more functions of each of the components in the same or similar manner as it is performed by a corresponding component before integration. According to various example embodiments, operations performed by a module, a program, or another component may be performed in a sequential, parallel, iterative, or heuristic manner. Alternatively, at least one of the operations may be performed in different sequence or omitted. Alternatively, at least one another operation may be added.

What is claimed is:

1. An operating method of a computing device for optimizing a program voltage and an erase voltage of a charge-trap memory device through a three-dimensional (3D) trap analysis, the operating method comprising:

applying, by a measurement module of a processor of the computing device, each of different trap control voltages to the memory device and measuring low-frequency noises of the memory device respectively corresponding to the trap control voltages;

extracting, by the processor, a trap distribution in the memory device for each of the trap control voltages based on the low-frequency noises, respectively; and analyzing, by the processor, the trap distribution according to depths of the memory device, and determining, by the processor, a target trap control voltage having a maximum trap distribution in a charge trap layer of the memory device, wherein the low-frequency noises include noise that occurs in a drain current of the memory device and noise corresponding to a flat band voltage of the memory device, respectively corresponding to the trap control voltages, wherein the extracting of the trap distribution comprises extracting the trap distribution in the memory device for each of the trap control voltages using a spectrum density of the noise that occurs in the drain current and a spectrum density of the noise corresponding to the flat band voltage, and wherein the determining of the target trap control voltage comprises verifying the trap distribution according to a depth belonging to the charge trap layer for each of the trap control voltages, based on a relationship between the trap distribution and the depths belonging to the charge trap layer, and determining a trap control voltage exhibiting the maximum trap distribution from among the trap control voltages as the target trap control voltage, based on a result of comparing the trap distribution according to the depth belonging to the charge trap layer among the trap control voltages.

2. The operating method of claim 1, wherein the target trap control voltage includes at least one of a program voltage and an erase voltage.

3. The operating method of claim 1, wherein the extracting of the trap distribution comprises extracting the trap distribution, using equations below, $$\frac{S_{I_D}}{I_D^2} = S_{cfo}\left(1 + \alpha\mu_{eff}C_{cz}\frac{I_D}{g_m}\right)^2 \cdot \left(\frac{g_m}{I_D}\right)^2, \text{ and}$$

$$S_{cf0} = \frac{q^2 k_B T \lambda N_t}{fWLCox^2}$$

where $I_D$ denotes the drain current, $S_{I_D}$ denotes a spectrum density of the noise that occurs in the drain current, $S_{vfb}$ denotes a spectrum density of the noise corresponding to the flat band voltage, $\alpha$ denotes a Coulomb scattering coefficient, $\mu_{eff}$ denotes effective mobility of charge, Cox denotes capacitance of an oxide layer of the memory device, $g_m$ denotes transconductance of the memory device, q denotes a charge amount, $k_B$ denotes a Boltzmann constant, T denotes absolute temperature, $\lambda$ denotes an interface between the charge trap layer and a tunneling layer and a tunneling distance of the tunneling layer, $N_t$ denotes a charge trap density, f denotes a frequency, W denotes a width of a channel region for injecting charges into the charge trap layer, and L denotes a length of the channel region.

4. The operating method of claim 1, wherein depths of the memory device are calculated using the following equation, $$\text{Depth} = \lambda \cdot \ln\left(\frac{1}{2\pi f \tau_0}\right)$$

where Depth denotes depths of the memory device, $\lambda$ denotes an interface between the charge trap layer and a tunneling layer and a tunneling distance of the tunneling layer, f denotes a frequency, and $\tau_0$ denotes a time constant in an interface region between the charge trap layer and the tunneling layer of the memory device.

5. The operating method of claim 1, wherein the trap control voltages include different pairs of program voltage and erase voltage, and at least one of the program voltage and the erase voltage is different, and the measuring of the low-frequency noises is iteratively performed for the pairs.

6. The operating method of claim 5, wherein the measuring of the low-frequency noises comprises:

measuring first low-frequency noise of the memory device by applying the program voltage of a single pair to the memory device; and measuring second low-frequency noise of the memory device by applying the erase voltage of the pair to the memory device, first low-frequency noises measured from the pairs are used to detect a program voltage having a maximum trap distribution in the charge trap layer, and second low-frequency noises measured from the pairs are used to detect an erase voltage having the maximum trap distribution in the charge trap layer.

7. A computing device for optimizing a program voltage and an erase voltage of a charge-trap memory device through a three-dimensional (3D) trap analysis, the computing device comprising:

a memory; and a processor configured to connect to the memory, and to execute at least one instruction stored in the memory, wherein the processor is configured to, by a measurement module, apply each of different trap control voltages to the memory device and measure low-frequency noises of the memory device respectively corresponding to the trap control voltages, extract a trap distribution in the memory device for each of the trap control voltages based on the low-frequency noises, respectively, and analyze the trap distributions according to depths of the memory device, and determine a target trap control voltage having a maximum trap distribution in a charge trap layer of the memory device, wherein the low-frequency noises include noise that occurs in a drain current of the memory device and noise corresponding to a flat band voltage of the memory device, respectively corresponding to the trap control voltages, wherein the processor is configured to extract the trap distribution by extracting the trap distribution in the memory device for each of the trap control voltages using a spectrum density of the noise that occurs in the drain current and a spectrum density of the noise corresponding to the flat band voltage, and wherein the processor is configured to determine the target trap control voltage by verifying the trap distribution according to a depth belonging to the charge trap layer for each of the trap control voltages, based on a relationship between the trap distribution and the depths belonging to the charge trap layer, and determining a trap control voltage exhibiting the maximum trap distribution from among the trap control voltages as the target trap control voltage, based on a result of comparing the trap distribution according to the depth belonging to the charge trap layer among the trap control voltages.

8. The computing device of claim 7, wherein the target trap control voltage includes at least one of a program voltage and an erase voltage.

\* \* \* \* \*